United States Patent
Na et al.

(10) Patent No.: US 7,570,935 B2
(45) Date of Patent: Aug. 4, 2009

(54) DERIVATIVE SUPERPOSITION CIRCUIT FOR LINEARIZATION

(75) Inventors: Yoo Sam Na, Seoul (KR); Byung Sung Kim, Suwon (KR); Won Jin Baek, Uiwang (KR); Moon Sun Kim, Suwon (KR)

(73) Assignee: Samsung Electro-Mechanics Co., Ltd., Suwon-Si, Gyunggi-Do (KR)

( * ) Notice: Subject to any disclaimer, the term of this patent is extended or adjusted under 35 U.S.C. 154(b) by 407 days.

(21) Appl. No.: 11/428,345

(22) Filed: Jun. 30, 2006

(65) Prior Publication Data

US 2007/0044024 A1    Feb. 22, 2007

(30) Foreign Application Priority Data

Aug. 17, 2005    (KR) ............ 10-2005-0075165

(51) Int. Cl.
H04B 1/10    (2006.01)
H04B 1/04    (2006.01)

(52) U.S. Cl. .............. 455/295; 455/114.2; 455/296

(58) Field of Classification Search .......... 455/278.1, 455/295, 341, 144, 114.2, 114.3, 277.2, 296, 455/253.2, 252.1, 63.1; 330/250, 251, 269, 330/277, 285
See application file for complete search history.

(56) References Cited

U.S. PATENT DOCUMENTS

| 5,889,665 | A | 3/1999 | Han |
| 6,819,184 | B2 * | 11/2004 | Pengelly et al. ............ 330/295 |
| 2005/0176399 | A1 * | 8/2005 | Aparin ...................... 455/341 |
| 2007/0285162 | A1 * | 12/2007 | Vitzilaios et al. ............ 330/149 |
| 2008/0204142 | A1 * | 8/2008 | Kang ......................... 330/281 |

FOREIGN PATENT DOCUMENTS

DE    198 09 283 A1    9/1999
JP    11-251848 A    9/1999

OTHER PUBLICATIONS

Barrie Gilbert, The Multi-tanh Principle: A Tutorial Overview, IEE Journal of Solid-State Circuits, vol. 33, No. 1, Jan. 1998.
German Patent Office, Office Action English Translation.
Bonkee Kim et al., "A New Linearization Technique for MOSFET RF Amplifier Using Multiple Gated Transistor", IEEE Microwave and Guided Wave Letters, vol. 10, No. 9, Sep. 2000.
Japanese Patent Office, Office Action issued Dec. 9, 2008.

* cited by examiner

*Primary Examiner*—Sonny Trinh
(74) *Attorney, Agent, or Firm*—Lowe Hauptman Ham & Berner

(57) ABSTRACT

A derivative superposition circuit for linearization includes a first active element that is provided with first to third terminals and in which the magnitude and direction of current flowing from the second terminal to the third terminal changes on the basis of the magnitude of a voltage applied between the first and second terminals; and a second active element that is provided with first to third terminals and has complementary characteristics with the first active element. The first terminals of the first and second active elements are connected to each other so that a predetermined operational bias voltage is maintained by first and second power supplies through a first impedance, and are connected to an input end through a second impedance. The third terminals of the first and second active elements are connected to an output end, and the second terminals of the first and second active elements are connected to the second power supply through a third impedance.

19 Claims, 4 Drawing Sheets

(A) $V_{B1}=0.3V$ (B) $V_{B2}=0.53V$ (C) $M_1+M_2+M_3$

DERIVATIVE SUPERPOSITION CIRCUIT FOR LINEARIZATION

CROSS-REFERENCE TO RELATED APPLICATIONS

The application claims the benefit of Korea Patent Application No. 2005-0075165 filed with the Korea Industrial Property Office on Aug. 17, 2005, the disclosure of which is incorporated herein by reference.

BACKGROUND OF THE INVENTION

1. Field of the Invention

The present invention relates to a derivative superposition circuit for linearization, in which transistors having a different gate length, which are supported in a general CMOS process, are used so that stable linearization is possible without delicate tuning, and a plurality of transistors can be operated only by one bias voltage so that a bias circuit can be easily constructed and the overall area of the circuit can be reduced.

2. Description of the Related Art

Recently, wireless communication systems with various purposes are commonly used through standardization. Accordingly, such a phenomenon increases where undesired signals are interfered with each other.

Further, the communication systems use a different frequency range. Therefore, if all the systems are perfectly linearized, the respective systems can communicate without being interfered with each other. However, since transmitters and receivers which are used in most of real communication systems are implemented of non-linearized circuits, such problems occur, which are caused by the mixture and modulation between signals generated while the signals pass through the non-linearized systems. Particularly, a third-order intermodulation distortion (hereinafter, referred to as IMD3) signal, which is generated when two strong signals in an adjacent frequency range are mixed while passing through non-linearized systems, distorts a desired signal in the operational frequency range of a system. Therefore, a third-order intercept point (hereinafter referred to as IP3) is defined so as to be used as an index representing the linearization of system.

As such, various studies for improving such linearization are being carried out, while the linearization of system is emphasized. Recently, a derivative superposition method is frequently used, which can improve IP3 of a CMOS low-noise amplifier.

FIG. 1 is a circuit diagram showing a derivative superposition circuit 100 according to a related art. As shown in FIG. 1, the derivative superposition circuit 100 includes a first MOSFET 101 and a second MOSFET 102 which has complementary characteristics with the first MOSFET 101.

The gates of the first and second MOSFETs 101 and 102 are connected to an input end IN through a first impedance 10, the drains of the first and second MOSFETs 101 and 102 are connected to an output end, and the sources of the first and second MOSFETs 101 and 102 are connected to a ground power supply 105 through a third impedance 108.

In the gate of the first MOSFET 101, a predetermined operational bias voltage is maintained by a gate-to-source voltage ($V_{GS}$) 103 and a ground power supply 105 through a first resistance 106a of the first impedance 106. In the gate of the second MOSFET 102, a predetermined operational bias voltage is maintained by the gate-to-source voltage ($V_{GS}$) 103 and an offset voltage ($V_{off}$) 105 through a second resistance 106b of the first impedance 106.

FIG. 2 is a graph showing simulation results of a second derivative gm" of trans-conductance with respect to the gate-to-source voltage $V_{GS}$ according to the related art.

As an offset voltage is applied to the gate of the second MOSFET so as to adjust an operational bias voltage of the second MOSFET, the maximum value region of the second derivative $gm_A$" of trans-conductance of the first MOSFET and the minimum value region of the second derivative $gm_B$" of trans-conductance of the second MOSFET have an opposite sign, as shown in FIG. 2. Accordingly, the IMD3 signals generated by two MOSFETs are offset around the threshold voltage of the first and second MOSFETs, which makes it possible to obtain a second derivative gm" of trans-conductance which is further linearized.

FIG. 3 is a circuit diagram showing a derivative superposition circuit according to another related art. FIGS. 4A to 4C are graphs showing simulation results of a second derivative gm" of trans-conductance with respect to a gate-to-source voltage $V_{GS}$ according to the related art.

FIG. 3A shows a derivative superposition circuit including a first MOSFET M1 which is operated by a constant gate-to-source bias voltage $V_{GS}$ and a derivative superposition circuit including a second MOSFET M2 which is operated by a bias voltage ($V_{GS}$–$V_{B1}$) in which a predetermined voltage $V_{B1}$ (=0.3V) is subtracted from the gate-to-source bias voltage $V_{GS}$. FIG. 3B shows a derivative superposition circuit in which the first and second MOSFETs, commonly connected to a signal input end, are connected to each other and a derivative superposition circuit including a third MOSFET M3 which is operated by a bias voltage ($V_{GS}$–$V_{B2}$) in which a predetermined voltage $V_{Bs}$ (=0.53V) is subtracted from the gate-to-source bias voltage $V_{GS}$. FIG. 3C shows a derivative superposition circuit in which the first, second, and third MOSFETs, commonly connected to a signal input end, are connected to each other.

When the peak value of the second derivative of trans-conductance is positive as shown in FIGS. 4A and 4B, a negative value of the second derivative of trans-conductance of the derivative circuit including the first MOSFET M1 or the derivative circuit in which the first and second MOSFETs M1 and M2 are connected is offset by a positive value of the second derivative of trans-conductance of the second MOSFET M2 or the third MOSFET M3. As a MOSFET having an adequate size and bias voltage is added, a linearized region is increasingly expanded as shown in FIG. 4C.

In the above-described derivative superposition circuit according to the related art, however, the offset voltage $V_{off}$ of FIG. 1 or the predetermined voltages $V_{B1}$ and $V_{B2}$ of FIG. 3 should be adjusted through delicate tuning, in order to perform stable linearization.

Further, since a bias circuit which controls the offset voltage $V_{off}$ of FIG. 1 or the predetermined voltages $V_{B1}$ and $V_{B2}$ of FIG. 3 should be added, constructing a bias circuit is not only easy, but the overall area of the circuit is also widened.

SUMMARY OF THE INVENTION

An advantage of the present invention is that it provides a derivative superposition circuit for linearization, in which transistors having a different gate length, which are supported in a general CMOS process, are used so that stable linearization is possible without delicate tuning, and a plurality of transistors can be operated only by one bias voltage so that a bias circuit can be easily constructed and the overall area of the circuit can be reduced.

Additional aspects and advantages of the present general inventive concept will be set forth in part in the description which follows and, in part, will be obvious from the description, or may be learned by practice of the general inventive concept.

According to an aspect of the invention, a derivative superposition circuit for linearization includes a first active element that is provided with first to third terminals and in which the magnitude and direction of current flowing the second terminal to the third terminal changes on the basis of the magnitude of a voltage applied between the first and second terminals; and a second active element that is provided with first to third terminals and has complementary characteristics with the first active element. The first terminals of the first and second active elements are connected to each other so that a predetermined operational bias voltage is maintained by first and second power supplies through a first impedance, and are connected to an input end through a second impedance. The third terminals of the first and second active elements are connected to an output end, and the second terminals of the first and second active elements are connected to the second power supply through a third impedance.

The first power supply is a voltage power supply which supplies a predetermined positive voltage applied between the first and second terminals, and the second power supply is a ground power supply.

The first, second and third terminals of the first and second active elements are a gate, source, and drain, respectively.

The gate lengths of the first and second active elements are different from each other, and the gate length of the first active element is shorter than the gate length of the second active element.

The second derivative of trans-conductance of current, flowing from the drain to the source, with respect to the first power supply has the maximum value in the first active element, the second derivative of trans-conductance of current, flowing from the drain to the source, with respect to the first power supply has the minimum value in the second active element, and the maximum value region of the first active element and the minimum value region of the second active element are caused to coincide with each other so as to be offset.

The first impedance is a resistance.
The second impedance is a capacitor.
The third impedance is an inductor.
The first and second active elements are MOSFETs.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
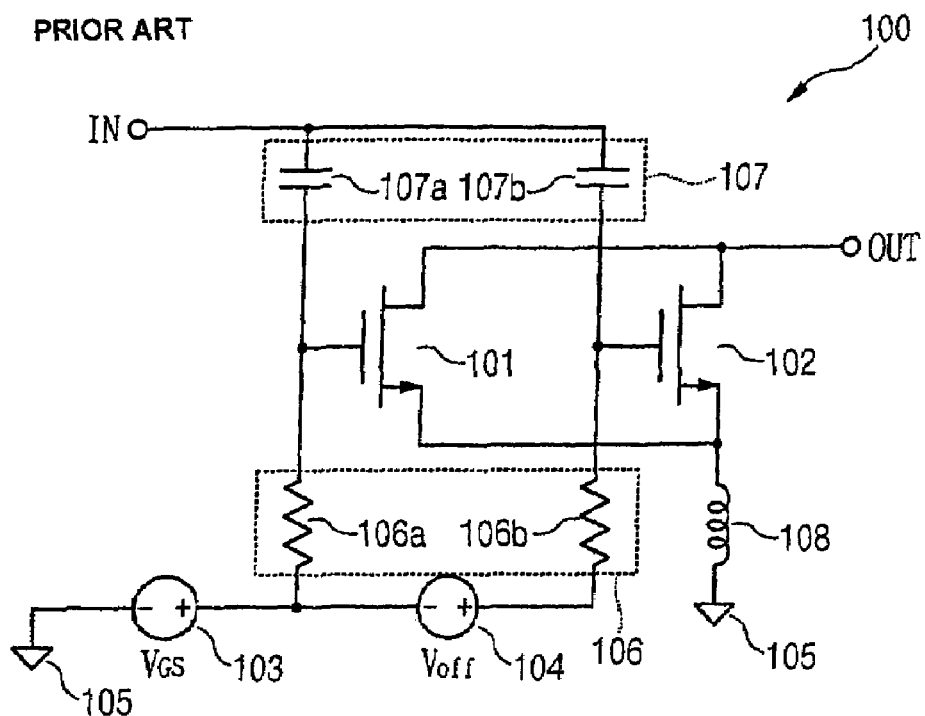
FIG. 1 is a circuit diagram showing a derivative superposition circuit according to a related art.
Figure 2:
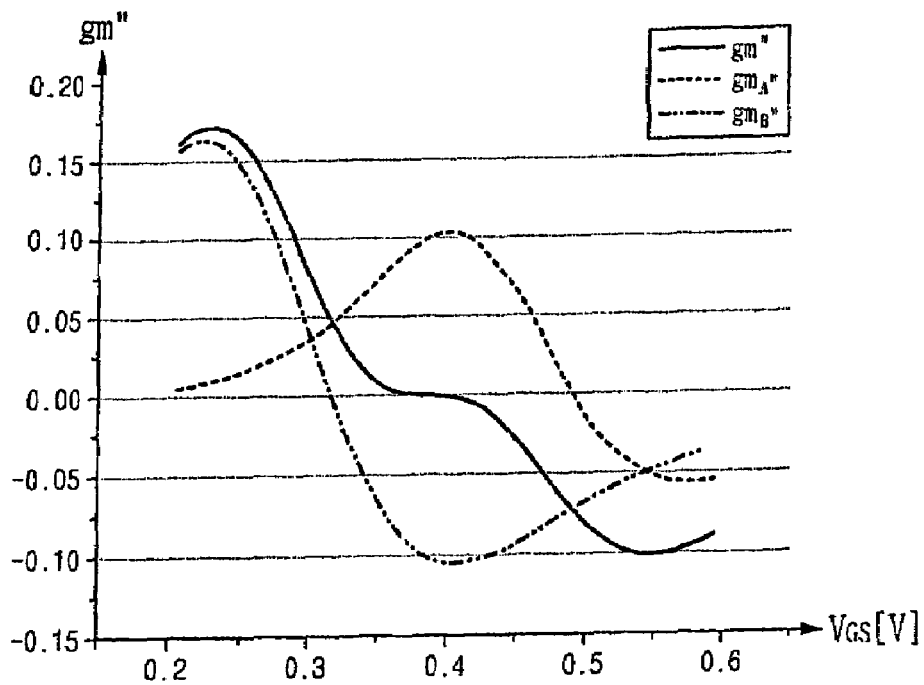
FIG. 2 is a graph showing simulation results of a second derivative of trans-conductance with respect to a gate-to-source voltage according to the related art.
Figure 3:
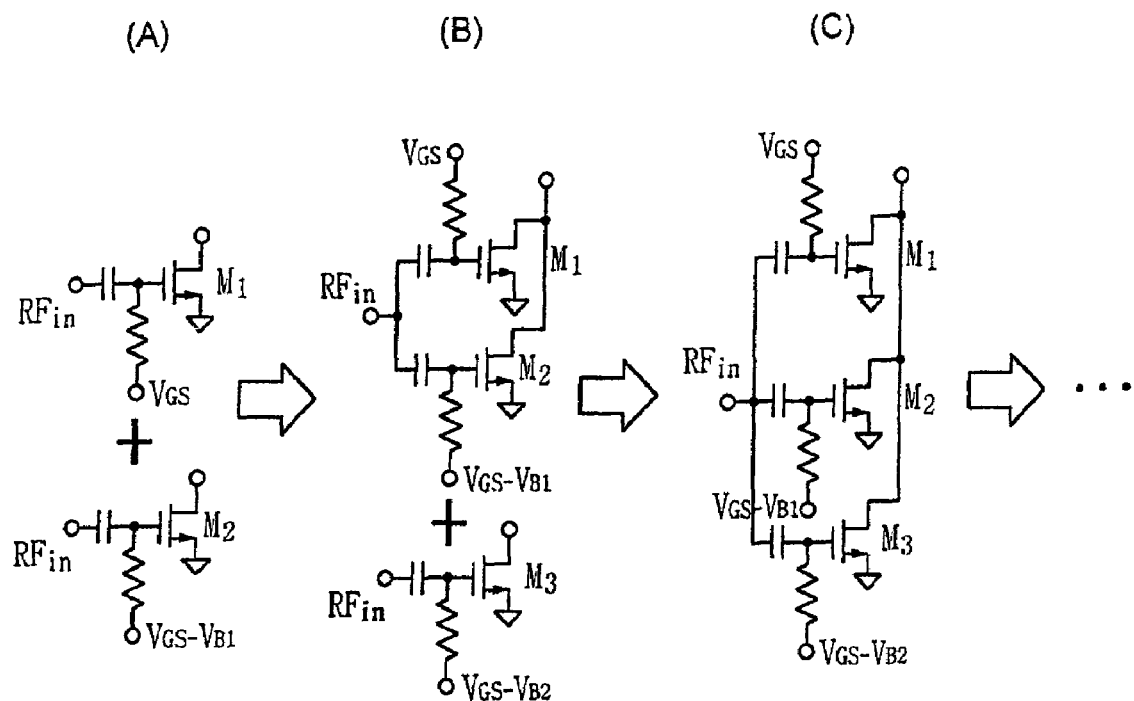
FIGS. 3A to 3C are circuit diagrams showing a derivative superposition circuit according to another related art.
Figure 4:
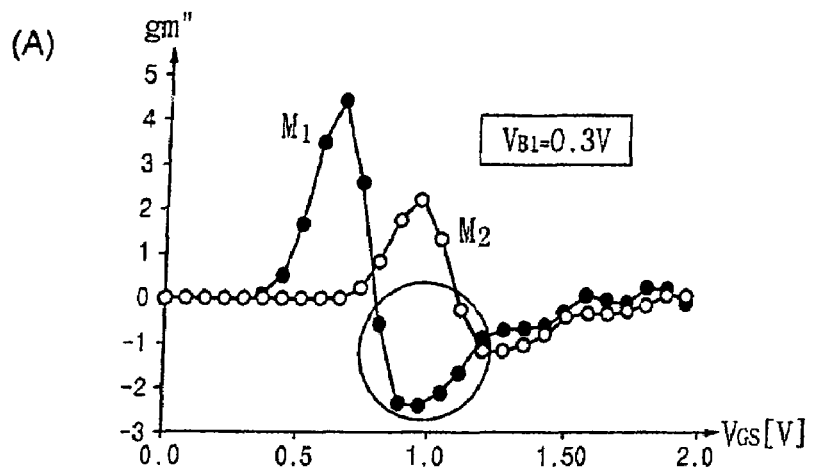
FIGS. 4A to 4C are graphs showing simulation results of a second derivative of trans-conductance with respect to a gate-to-source voltage according to the related art.
Figure 4:
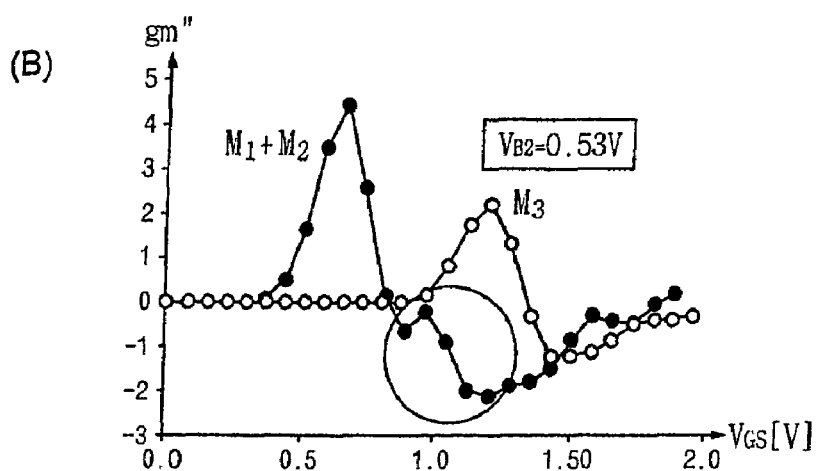
Figure 4:
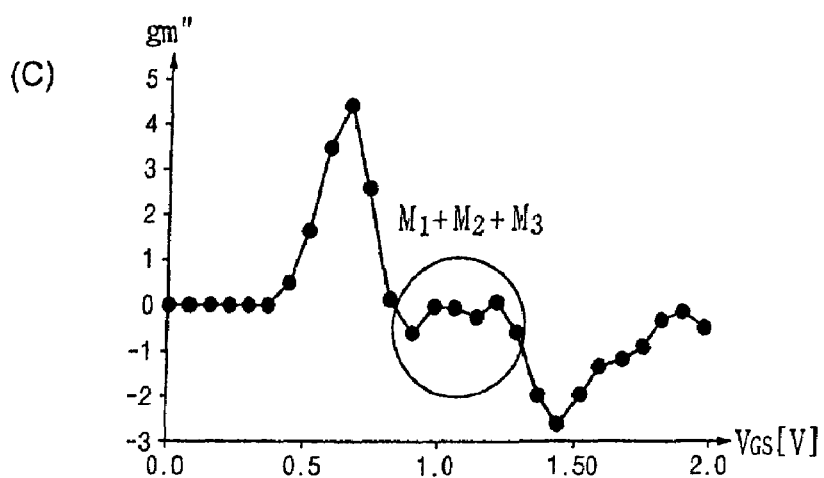

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Hereinafter, a preferred embodiment of the present invention will be described in detail with reference to the accompanying drawings.

Figure 5:
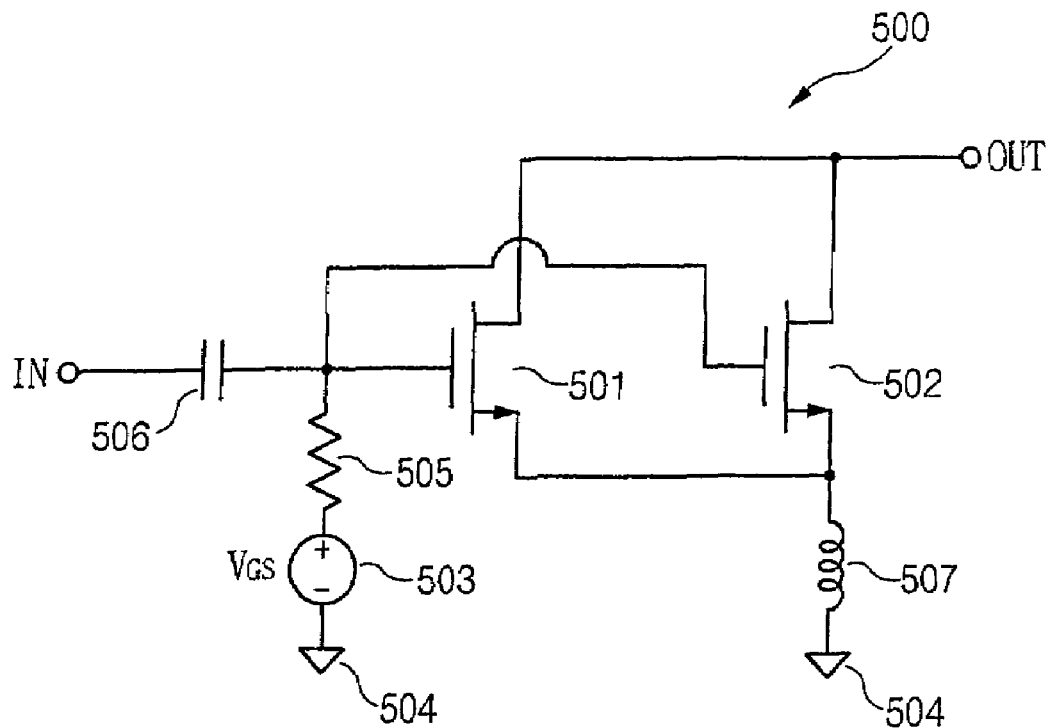
FIG. 5 is a circuit diagram showing a derivative superposition circuit according to the present invention.

FIG. 5 is a circuit diagram showing a derivative superposition circuit 500 according to the present invention. As shown in FIG. 5, the derivative superposition circuit 500 includes a first active element 501 and a second active element 502 having a complementary characteristic with respect to the first active element 501.

The first active element 501 is provided with a gate, source, and drain. In accordance with the magnitude and polarity of a voltage applied to the gate and source, the amount and direction of current flowing from the source to the drain or flowing from the drain to the source are determined. Further, the second active element 502 is also provided with a gate, source, and drain. In accordance with the magnitude and polarity of a voltage applied to the gate and source, the amount and direction of current flowing from the source to the drain or flowing from the drain to the source are determined. In this case, the amount and direction of current in the second active element 502 are determined complementarily with respect to the first active element 501.

In other words, when the magnitude of the current from the drain to the source changes in proportion to the magnitude of the gate-to-source voltage in the first active element 501, the magnitude of the current from the source to the drain changes in proportion to the magnitude of the gate-to-source voltage in the second active element 502.

As such active elements, there are provided a bipolar junction transistor (BJT), a junction field effect transistor (JFET), a metal oxide semiconductor field-effect transistor (MOSFET), a metal semiconductor field effect transistor (MESFET) and the like.

A certain active element is further provided with a body terminal in addition to a gate, source, and drain. In such an active element, the amount and direction of current flowing from the source to the drain or flowing from the drain to the source are determined, in accordance with the magnitude and polarity of a voltage applied between the gate and body terminal.

As an active element in this case, there is provided a metal oxide semiconductor field-effect transistor (MOSFET).

Hereinafter, the description on the active element will be focused on the MOSFET. However, the technical idea of the present invention can be applied to all active elements, which can be used as an amplifier, as well as the MOSFET. Therefore, although the description on the active element is focused on the MOSFET in this specification, the concept and scope of the invention is not limited to the MOSFET.

The gates of the first and second active elements 501 and 502 are connected to each other so that a predetermined operational bias voltage is maintained by first and second power supplies 503 and 504 through a first impedance 505, and are connected to an input end IN through a second impedance 506.

According to a preferred embodiment of the invention, the first power supply 503 as a voltage power supply, which supplies a predetermined positive voltage applied between the gate and source, is such a power supply source that can supply a positive voltage having the same magnitude as the gate-to-source voltage, and the second power supply 504 corresponds to a ground power supply. Further, as the first impedance 505 that maintains a predetermined operational bias voltage in the first active element 501, a resistance is preferably used. As the second impedance 506 connected to the input end IN, a capacitor is preferably used.

Since the gates of the first and second active elements 501 and 502 are connected to each other, only one gate bias voltage is required as the same operational bias voltage is applied by the first and second power supplies 503 and 504. Therefore, constructing the bias circuit becomes easy, and the overall area of the circuit can be reduced.

The drains of the first and second active elements 501 and 502 are connected to an output end OUT, and the sources of the first and second active elements 501 and 502 are connected to the second power supply 504 through a third impedance 507.

As the third impedance 507 which connects the second power supply 504 to the sources of the first and second active elements 501 and 502, an inductor is preferably used.

Figure 6:
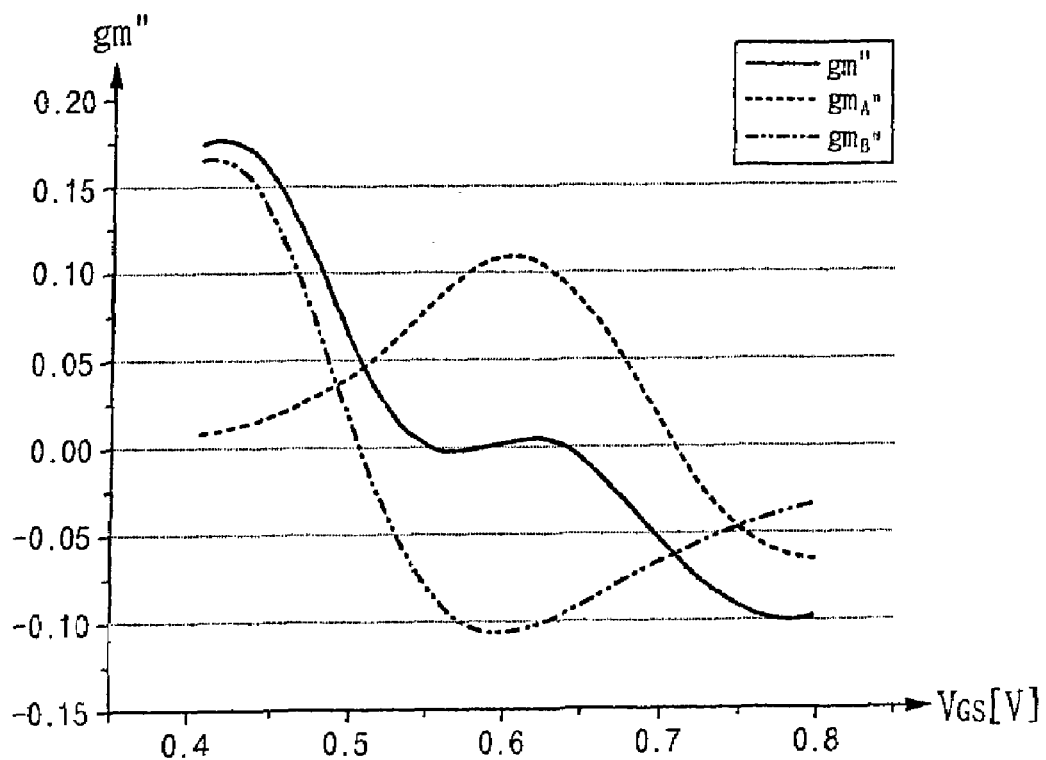
FIG. 6 is a graph showing simulation results of a second derivative of trans-conductance with respect to a gate-to-source voltage according to the invention.

FIG. 6 is a graph showing a simulation result of a second derivative of trans-conductance with respect to the gate-to-source voltage according to the present invention.

The first and second active elements are supported through a general CMOS process. The respective gate lengths thereof are different from each other, and the gate length of the first active element is shorter than that of the second active element. Typically, as the first active element, an active element whose gate length is 0.18 μm is used. As the second active element, an active element which has a desired characteristic is selected among the active elements of which the gate length is larger than that of the first active element.

Since the first and second active elements, which are supported through different CMOS processes, basically have a different thickness of oxide, the gate lengths thereof are different from each other. Accordingly, the first and second active elements have different characteristics in various aspects such as a threshold voltage.

Therefore, in the method of improving linearity which is proposed in the present invention, complementary characteristics between the active elements of which the gate lengths are different from each other are used. For example, the active elements have a different threshold voltage.

When the gates of the first and second active elements, which are complementary with each other, are connected to each other by using transistors of which the gate lengths are different and a bias voltage between the gate and source is suitably set so that the same input signal is applied to the gates, the region having the maximum value of the second derivative $gm_A''$ of trans-conductance of the first active element and the region having the minimum value of the second derivative $gm_B''$ of trans-conductance of the second active element can be set to coincide with each other around a threshold voltage of the first and second active elements, as shown in FIG. 6.

The maximum value region of the second derivative $gm_A''$ of trans-conductance of the first active element and the minimum value region of the second derivative $gm_B''$ of trans-conductance of the second active element are set to have an opposite sign to each other. Further, the inverse is also possible.

Therefore, IMD3 signals generated by two of the active elements are offset to thereby obtain a linearized second derivative gm" of trans-conductance in which IP3 characteristics are improved.

Further, as the operational bias voltage of the first and second active elements is adjusted by using transistors of which the gate lengths are different from each other, an additional bias circuit such as an offset voltage $V_{off}$ or the like is not need, different from the related art. Therefore, stable linearization is possible without delicate tuning, and a bias circuit can be easily constructed. Further, the overall area of the circuit is reduced.

According to the derivative superposition circuit of the present invention, the transistors which are supported in a general CMOS process and of which the gate lengths are different from each other are used, so that stable linearization is possible without delicate tuning.

Further, since a plurality of transistors can be operated only by one bias voltage, the bias circuit can be easily constructed and the overall area of the circuit can be reduced.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A derivative superposition circuit for linearization comprising:
    a first active element which is provided with first to third terminals and in which the magnitude and direction of a current flowing from the second terminal to the third terminal changes on the basis of the magnitude of a voltage applied between the first and second terminals; and
    a second active element which is provided with first to third terminals and has complementary characteristics to the first active element,
    wherein the first terminals of the first and second active elements are connected to each other so that a predetermined operational bias voltage is maintained at said first terminals by first and second power supplies through a first impedance, and said first terminals are connected to an input end through a second impedance, and
    wherein the third terminals of the first and second active elements are connected to an output end, and the second terminals of the first and second active elements are connected to the second power supply through a third impedance.

2. The derivative superposition circuit for linearization according to claim 1,
    wherein the first power supply is a voltage power supply which supplies a predetermined positive voltage applied between the first and second terminals of each of the active elements, and the second power supply is a ground power supply.

3. The derivative superposition circuit for linearization according to claim 2,
    wherein the first, second and third terminals of each of the first and second active elements are a gate, a source, and a drain, respectively.

4. The derivative superposition circuit for linearization according to claim 3, wherein the gate length of the first active element is shorter than the gate length of the second active element.

5. The derivative superposition circuit for linearization according to claim 4, wherein
the second derivative of trans-conductance of the current flowing from the drain to the source of the first active element, with respect to the first power supply, has a maximum value in a maximum value region of the first active element,
the second derivative of trans-conductance of the current flowing from the drain to the source of the second active element, with respect to the first power supply, has a minimum value in a minimum value region of the second active element, and
the maximum value region of the first active element and the minimum value region of the second active element coincide with each other so as to offset each other.

6. The derivative superposition circuit for linearization according to claim 1, wherein the first impedance is a resistance.

7. The derivative superposition circuit for linearization according to claim 1, wherein the second impedance is a capacitor.

8. The derivative superposition circuit for linearization according to claim 1, wherein the third impedance is an inductor.

9. The derivative superposition circuit for linearization according to claim 1,
wherein the first and second active elements are MOSFETs.

10. The derivative superposition circuit for linearization according to claim 1, wherein
the first, second and third terminals of each of the first and second active elements are a gate, a source, and a drain, respectively; and
the gate length of the first active element is shorter than the gate length of the second active element.

11. The derivative superposition circuit for linearization according to claim 10, wherein
the second derivative of trans-conductance of the current flowing from the drain to the source of the first active element has a maximum value in a first region of the first power supply;
the second derivative of trans-conductance of the current flowing from the drain to the source of the second active element has a minimum value in a second region of the first power supply; and
the first region and the second region coincide with each other.

12. The derivative superposition circuit for linearization according to claim 10, comprising at least one selected from the group consisting of
(a) the first impedance is a resistance;
(b) the second impedance is a capacitor; and
(c) the third impedance is an inductor.

13. The derivative superposition circuit for linearization according to claim 10, wherein
the first and second active elements are MOSFETs.

14. A derivative superposition circuit for linearization comprising:
first and second transistors having complementary characteristics with respect to each other, each of the transistors comprising a gate, a source and a drain; and
first, second and third impedances each comprising opposite first and second terminals;
wherein
the gates of the transistors are commonly connected to each other, to the first terminal of the first impedance, and to the first terminal of the second impedance;
the sources of the transistors are commonly connected to each other, and to the first terminal of the third impedance;
the drains of the transistors are commonly connected to each other, and to an output end;
the second terminals of the first, second and third impedances are connected to a first power supply, an input end, and a second power supply, respectively; and
a predetermined operational bias voltage applied by the first and second power supplies across the gate and the source of the first transistor is same as that of the second transistor.

15. The derivative superposition circuit for linearization according to claim 14, wherein the first power supply is a positive voltage power supply, and the second power supply is a ground power supply.

16. The derivative superposition circuit for linearization according to claim 14, wherein a gate length of the first transistor is shorter than that of the second transistor.

17. The derivative superposition circuit for linearization according to claim 16, wherein
the second derivative of trans-conductance of a current flowing from the drain to the source of the first transistor has a maximum value in a first region of the first power supply;
the second derivative of trans-conductance of a current flowing from the drain to the source of the second transistor has a minimum value in a second region of the first power supply; and
the first region and the second region coincide with each other.

18. The derivative superposition circuit for linearization according to claim 14, comprising at least one selected from the group consisting of
(a) the first impedance is a resistance;
(b) the second impedance is a capacitor; and
(c) the third impedance is an inductor.

19. The derivative superposition circuit for linearization according to claim 14, wherein
the first and second transistors are MOSFETs.

* * * * *